US008248136B1

(12) United States Patent
Zhang et al.

(10) Patent No.: US 8,248,136 B1
(45) Date of Patent: Aug. 21, 2012

(54) LOW-POWER, GLITCH-LESS, CONFIGURABLE DELAY ELEMENT

(75) Inventors: Fulong Zhang, Upper Macungie, PA (US); Zheng Chen, Upper Macungie, PA (US); Chien Kuang Chen, San Jose, CA (US); John Schadt, Bethlehem, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 81 days.

(21) Appl. No.: 13/007,804

(22) Filed: Jan. 17, 2011

(51) Int. Cl.
*H03H 11/26* (2006.01)

(52) U.S. Cl. .................. 327/277; 327/262; 327/284

(58) Field of Classification Search .................. 327/149, 327/158, 261, 262, 269–272, 276–278, 284
See application file for complete search history.

(56) References Cited

U.S. PATENT DOCUMENTS

| | | | | |
|---|---|---|---|---|
| 4,675,562 | A * | 6/1987 | Herlein et al. | 327/277 |
| 5,465,076 | A * | 11/1995 | Yamauchi et al. | 331/179 |
| 6,184,735 | B1 * | 2/2001 | Kobayashi | 327/276 |
| 6,489,826 | B2 * | 12/2002 | Truong et al. | 327/259 |
| 6,580,304 | B1 * | 6/2003 | Rieven | 327/276 |
| 6,847,246 | B1 | 1/2005 | Kaviani et al. | |
| 7,009,433 | B2 | 3/2006 | Zhang et al. | |
| 7,126,399 | B1 * | 10/2006 | Lee | 327/261 |
| 7,391,246 | B1 * | 6/2008 | Lu | 327/161 |
| 7,495,495 | B2 | 2/2009 | Zhang et al. | |
| 7,642,831 | B2 * | 1/2010 | Nguyen | 327/231 |
| 7,659,764 | B2 | 2/2010 | Fung et al. | |
| 7,893,741 | B2 * | 2/2011 | Cao et al. | 327/161 |
| 8,046,601 | B1 * | 10/2011 | Paz et al. | 713/300 |

OTHER PUBLICATIONS

U.S. Appl. No. 11/939,787, filed Nov. 14, 2007.
U.S. Appl. No. 12/813,573, filed Jun. 11, 2010.

* cited by examiner

*Primary Examiner* — Lincoln Donovan
*Assistant Examiner* — William Hernandez
(74) *Attorney, Agent, or Firm* — Mendelsohn, Drucker & Associates, P.C.

(57) ABSTRACT

In one embodiment, a configurable delay element has three stages. The first stage has an 8-buffer first delay chain and an (8×1) first mux that selects one of the eight first-delay-chain outputs. The second stage has a 24-buffer second delay chain connected to receive the first-mux output and organized into three 8-buffer sub-chains and a (4×1) second mux that selects one of the four second-delay-chain outputs. The third stage has a 96-buffer third delay chain connected to receive the second-mux output and organized into three 32-buffer sub-chains and a (4×1) third mux that selects one of the four third-delay-chain outputs as the delay-element output signal. A delay-element controller provides glitch-less updates to the signal used to control the delay-element muxes by timing those updates to occur when all delay-element buffers have the same state. The controller bases the update timing on the delay-element output signal.

20 Claims, 5 Drawing Sheets

100

PRIOR ART

200

LOW-POWER, GLITCH-LESS, CONFIGURABLE DELAY ELEMENT

TECHNICAL FIELD

The present invention relates to electronics, and, more specifically but not exclusively, to delay elements for high-speed receiver interfaces.

BACKGROUND

This section introduces aspects that may help facilitate a better understanding of the invention. Accordingly, the statements of this section are to be read in this light and are not to be understood as admissions about what is prior art or what is not prior art.

Most receiver interfaces are implemented with a delay element that nominally applies a phase shift of 90 degrees to an input clock signal (A) to produce a phase-shifted output clock signal (Z) that can be used, for example, to sample a received data signal. Since the amount of delay provided by a delay element can drift over time due to variations in voltage (V) and/or temperature (T), a receiver interface is typically implemented with a configurable delay element that can delay the input clock signal Z by an amount of delay selected from a range of possible delay values. Such a receiver interface will also include a delay-locked loop (DLL)-based controller that dynamically generates and updates the delay code (i.e., control signal) used to select and change the amount of delay provided by the configurable delay element to track V/T variations during operation.

FIG. 1 shows a schematic block diagram of a prior-art configurable delay element 100 that can be used to provide a selectable phase shift in a receiver interface. Delay element 100 applies a selected amount of delay to an input (e.g., clock) signal A to generate a delayed (i.e., phase-shifted) output (e.g., clock) signal Z, where the amount of delay is selected from 128 different possible amounts of delay based on a 7-bit delay code SEL<6:0>.

In particular, delay element 100 has a delay chain 110 consisting of 128 serially connected, non-inverting buffers, where AND gate 112 functions as the first buffer and is followed by 127 inverter-based buffers 114, where each inverter-based buffer consists of a pair of serially connected inverters. The outputs of the first eight buffers (i.e., AND gate 112 and the first seven inverter-based buffers 114) in delay chain 110 are applied to the inputs of a first (8×1) multiplexer (mux) 120_1. Similarly, the outputs of the next eight inverter-based buffers 114 are applied to the inputs of a second (8×1) mux 120_2, and so on until the outputs of the last eight inverter-based buffers 114 are applied to the input of a sixteenth (8×1) mux 120_16. The outputs of the 16 muxes 120_1 to 120_16 are determined by the three bits SEL<2:0> of the 7-bit delay code SEL. For example, if SEL<2:0> is [000], then each mux 120_i outputs its first input signal. Similarly, if SEL<2:0> is [001], then each mux 120_i outputs its second input signal, and so on. Muxes 120_1 to 120_16 form a first stage of muxes in delay element 100.

The outputs of the first eight (8×1) muxes 120_1 to 120_8 are applied to the inputs of (8×1) mux 140_1, while the outputs of the last eight (8×1) muxes 120_9 to 120_16 are applied to the inputs of (8×1) mux 140_2. The outputs of muxes 140_1 and 140_2 are determined by the three bits SEL<5:3> of the 7-bit delay code SEL. For example, if SEL<5:3> is [000], then each mux 140_i outputs its first input signal. Similarly, if SEL<5:3> is [001], then each mux 140_i outputs its second input signal, and so on. Muxes 140_1 and 140_2 form a second stage of muxes in delay element 100.

The outputs of muxes 140_1 and 140_2 are applied to the inputs of (2×1) mux 160. The output of mux 160 is determined by the one bit SEL<6> of the 7-bit delay code SEL. If SEL<6> is [0], then mux 160 outputs its first input signal. Similarly, if SEL<6> is [1], then mux 160 outputs its second input signal. Mux 160 forms a third stage of muxes in delay element 100.

In this way, by setting delay code SEL<6:0> to the appropriate 7-bit value, delay element 100 will apply a desired one of the 128 different possible amounts of delay to input signal A in generating phase-shifted output signal Z.

As shown in FIG. 1, AND gate 112 receives both input signal A and an enable signal ENABLE that can be used to disable delay chain 110 and power down delay element 100. In particular, if the enable signal is high, then AND gate 112 allows input signal A to propagate through delay chain 110. As input signal A cycles between high and low, the 128 different buffers within delay chain 110 will also toggle between high and low, thereby consuming AC power. However, if the enable signal is low, then AND gate 112 blocks input signal A from propagating through delay chain 110. In that case, a continuous low signal will be applied to the rest of delay chain 110, and the 128 different buffers will not toggle, thereby reducing the consumption of AC power, effectively powering down delay element 100.

AND gate 112 can be used to reduce power consumption during operations of the receiver interface in which delay element 100 is not needed to apply a phase shift to input signal A. Note, however, that, when delay element 100 is used to apply a phase shift to input signal A, all 128 buffers in delay chain 110 will continue to toggle with every change in input signal A between high and low, no matter what amount of delay is selected for output signal Z. As a result and for example, the amount of power consumed by delay element 100 will be substantially the same if delay element 100 is controlled to select the output of the first buffer (i.e., AND gate 112) as output signal Z (i.e., by setting SEL<6:0> to [0000000]) or if delay element 100 is controlled to select the output of the last buffer (i.e., the 127$^{th}$ inverter-based buffer 114) as output signal Z (i.e., by setting SEL<6:0> to [1111111]).

Another problem with delay element 100 relates to glitches that can occur when the DLL-based controller (not shown in FIG. 1) changes the value of delay code SEL<6:0> to adjust the amount of delay applied by delay element 100. Such delay code updates can result in temporary transitions (i.e., glitches) in output signal Z that, in turn, can adversely affect downstream processing resulting in data corruption and/or word misalignment.

SUMMARY

In one embodiment, the present invention is an integrated circuit having a configurable delay element connected to generate an output signal as a delayed version of an input signal. The delay element comprises a first stage and a second stage. The first stage comprises (i) a first delay chain having N buffers connected to receive the input signal and generate N differently delayed versions of the input signal and (ii) an (N×1) first mux connected to receive the N versions of the input signal and output one of the N versions of the input signal as a first-stage output signal. The second stage comprises (i) a second delay chain having N(M−1) buffers connected to receive the first-stage output signal and organized into (M−1) sub-chains to generate M differently delayed versions of the first-stage output signal and (ii) an (M×1) second mux connected to receive the M versions of the first-stage output signal and output one of the M versions of the first-stage output signal as a second-stage output signal.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
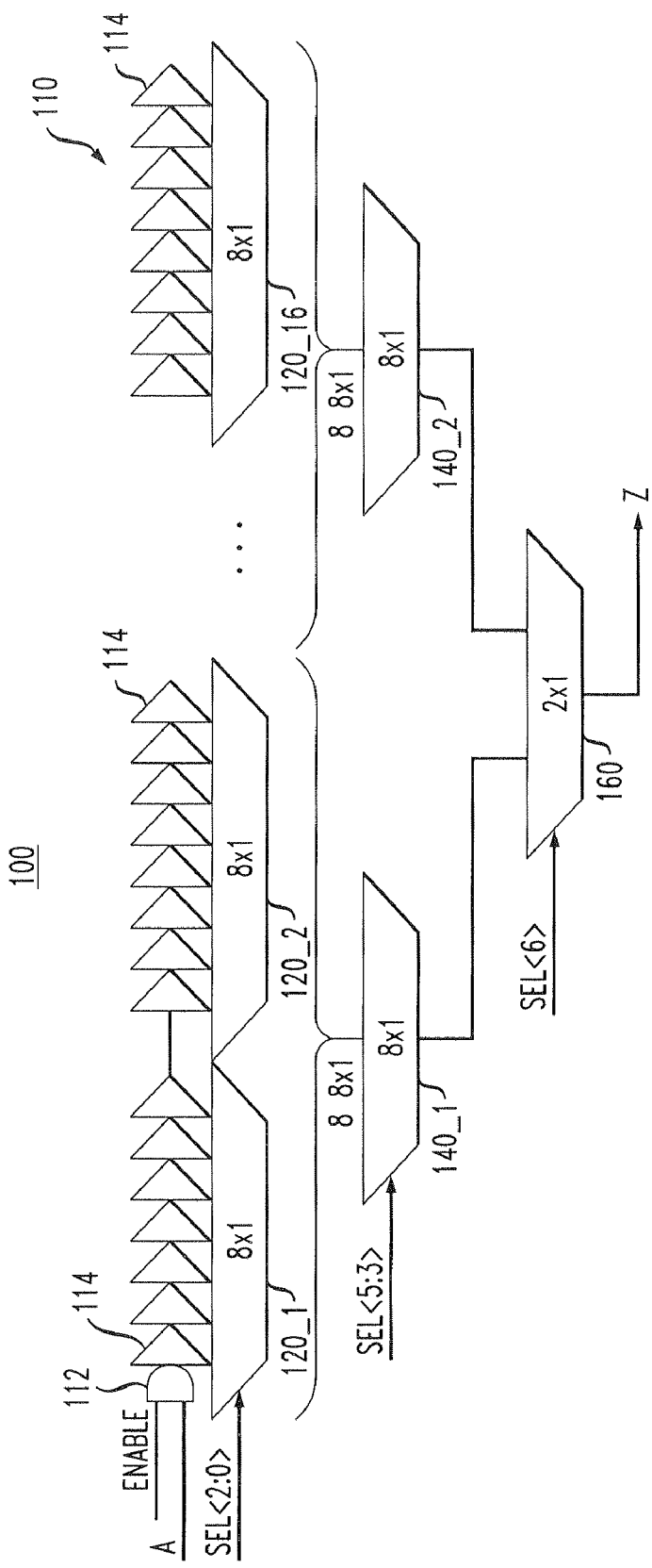
FIG. 1 shows a schematic block diagram of a prior-art configurable delay element that can be used to provide a selectable phase shift in a receiver interface.
Figure 2:
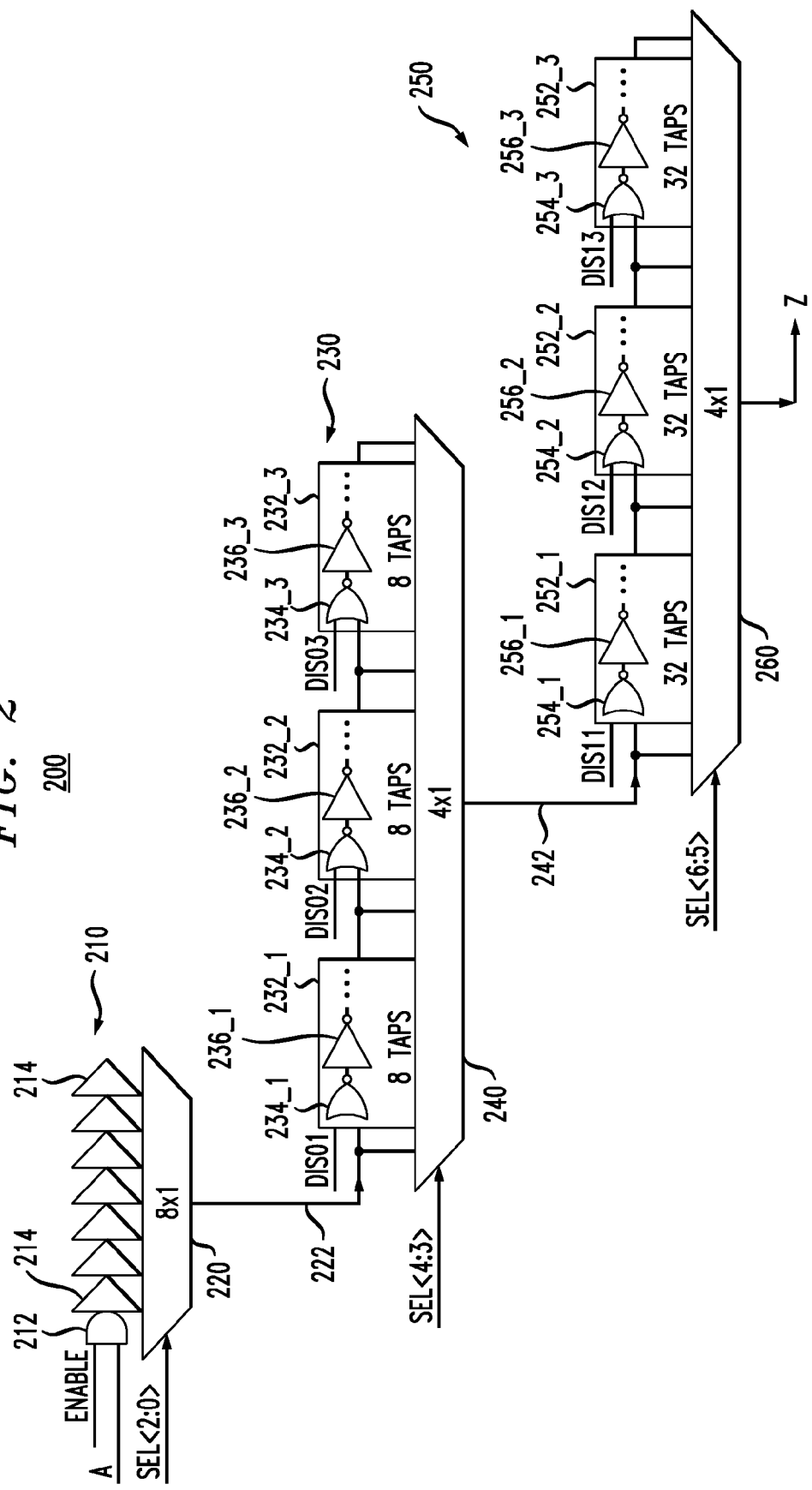
FIG. 2 shows a schematic block diagram of a configurable delay element that can be used to provide a selectable phase shift in a receiver interface, according to one embodiment of the present invention.

FIG. 2 shows a schematic block diagram of a configurable delay element 200 that can be used to provide a selectable phase shift in a receiver interface, according to one embodiment of the present invention. Like delay element 100 of FIG. 1, delay element 200 applies a selected amount of delay to an input signal A to generate a delayed (i.e., phase-shifted) output signal Z, where the amount of delay is selected from 128 different possible amounts of delay based on a 7-bit delay code SEL<6:0>.

Instead of having eighteen (8×1) muxes and one (2×1) mux as in delay element 100, delay element 200 has only one (8×1) mux 220 and two (4×1) muxes 240 and 260. In addition, instead of having a single delay chain of 128 buffers as in delay element 100, delay element 200 has three different delay chains: an 8-buffer delay chain 210, a 24-buffer delay chain 230, and a 96-buffer delay chain 250.

Serially connected delay chain 210 consists of an AND gate 212 followed by seven inverter-based buffers 214, which are analogous to inverter-based buffers 114 of FIG. 1. AND gate 212 functions similar to AND gate 112 of FIG. 1 to enable delay element 200 to be powered down by setting the enable signal low.

The outputs of the eight buffers in delay chain 210 are applied to the inputs of (8×1) mux 220. The output 222 of mux 220 is determined by the three bits SEL<2:0> of the 7-bit delay code SEL. For example, if SEL<2:0> is [000], then mux 220 outputs its first input signal (i.e., the output of AND gate 212) as signal 222. Similarly, if SEL<2:0> is [001], then mux 220 outputs its second input signal (i.e., the output of the first inverter-based buffer 214 in delay chain 210) as signal 222, and so on. Delay chain 210 and mux 220 forms a first stage in delay element 200.

The output 222 of mux 220 is applied to the input of delay chain 230. The 24 buffers of delay chain 230 are configured into three serially connected, 8-buffer sub-chains 232_1 to 232_3, where each serially connected sub-chain 232_i comprises a first buffer having a NOR gate 234_i and an inverter 236_i followed by seven inverter-based buffers 214 (not explicitly shown in FIG. 2).

In addition to being applied to the input of delay chain 230, the output 222 of mux 220 is also applied to the first input port of (4×1) mux 240, while the outputs of the three sub-chains 232_1 to 232_3 are applied to the last three input ports of mux 240. For purposes of this specification, mux 240 is said to receive the four outputs from delay chain 230, although technically the output 222 of mux 220 is not generated by delay chain 230. The output 242 of mux 240 is determined by the two bits SEL<4:3> of the 7-bit delay code SEL. For example, if SEL<4:3> is [00], then mux 240 outputs its first input signal as signal 242. Similarly, if SEL<4:3> is [01], then mux 240 outputs its second input signal as signal 242, and so on. Delay chain 230 and mux 240 forms a second stage in delay element 200.

The output 242 of mux 240 is applied to the input of delay chain 250. The 96 buffers of delay chain 250 are configured into three serially connected, 32-buffer sub-chains 252_1 to 252_3, where each serially connected sub-chain 252_i comprises a first buffer having a NOR gate 254_i and an inverter 256_i followed by 31 inverter-based buffers 214 (not explicitly shown in FIG. 2).

In addition to being applied to the input of delay chain 250, the output of mux 240 is also applied to the first input port of (4×1) mux 260, while the outputs of the three sub-chains 252_1 to 252_3 are applied to the last three input ports of mux 260. For purposes of this specification, mux 260 is said to receive the four outputs from delay chain 250, although technically the output 242 of mux 240 is not generated by delay chain 250. The output of the mux 260 (i.e., output signal Z) is determined by the two bits SEL<6:5> of the 7-bit delay code SEL. For example, if SEL<6:5> is [00], then mux 260 outputs its first input signal as output signal Z. Similarly, if SEL<6:5> is [01], then mux 260 outputs its second input signal, and so on as output signal Z. Delay chain 250 and mux 260 forms a third stage in delay element 200.

In this way, by setting delay code SEL<6:0> to the appropriate 7-bit value, delay element 200 will apply a desired one of the 128 different possible amounts of delay to input signal A in generating phase-shifted output signal Z.

As shown in FIG. 2, NOR gate 234_1 receives both the output 222 of mux 220 and a disable signal DIS01 that can be used to disable sub-chains 232_1 to 232_3 and selectively power down that portion of delay element 200. In particular, if disable signal DIS01 is low, then NOR gate 234_1 allows the output of mux 220 to propagate through sub-chain 232_1. As the output of mux 220 cycles between high and low, the eight different buffers within sub-chain 232_1 will also toggle between high and low, thereby consuming AC power. However, if disable signal DIS01 is high, then NOR gate 234_1 blocks the output of mux 220 from propagating through sub-chain 232_1. In that case and in particular, the output of NOR gate 234_1 will be low, the output of inverter 236_1 will be high, a continuous high signal will be applied to the rest of sub-chain 232_1, and the eight different buffers in that sub-chain will not toggle, thereby reducing the consumption of AC power. Moreover, since the output of sub-chain 232_1 is applied to NOR gate 234_2 at the input of sub-chain 232_2, and since the output of sub-chain 232_2 is applied to NOR gate 234_3 at the input of sub-chain 232_3, setting disable signal DIS01 high, will also effectively power down those two sub-chains as well (independent of the values of disable signals DIS02 and DIS03), thereby further reducing power consumption by delay element 200.

Similarly, NOR gate 234_2 receives both the output of sub-chain 232_1 and disable signal DIS02, which can be used to disable sub-chains 232_2 and 232_3 (even if sub-chain 232_1 is enabled) and selectively power down that portion of delay element 200. In particular, assuming that sub-chain 232_1 is enabled, if disable signal DIS02 is low, then NOR gate 234_2 allows the output of sub-chain 232_1 to propagate through sub-chain 232_2. As the output of sub-chain 232_1 cycles between high and low, the eight different buffers within sub-chain 232_2 will also toggle between high and low, thereby consuming AC power. However, if disable signal DIS02 is high, then NOR gate 234_2 blocks the output of sub-chain 232_1 from propagating through sub-chain 232_2. In that case and in particular, the output of NOR gate 234_2 will be low, the output of inverter 236_2 will be high, a continuous high signal will be applied to the rest of sub-chain 232_2, and the eight different buffers in that sub-chain will not toggle, thereby reducing the consumption of AC power. Moreover, since the output of sub-chain 232_2 is applied to NOR gate 234_3 at the input of sub-chain 232_3, setting disable signal DIS02 high, will also effectively power down that sub-chain as well (independent of the value of disable signal DIS03), thereby further reducing power consumption by delay element 200.

Lastly, NOR gate 234_3 receives both the output of sub-chain 232_2 and disable signal DIS03, which can be used to disable sub-chain 232_3 (even if sub-chains 232_1 and 232_2 are enabled) and selectively power down that portion of delay element 200. In particular, assuming that sub-chains 232_1 and 232_2 are enabled, if disable signal DIS03 is low, then NOR gate 234_3 allows the output of sub-chain 232_2 to propagate through sub-chain 232_3. As the output of sub-chain 232_2 cycles between high and low, the eight different buffers within sub-chain 232_3 will also toggle between high and low, thereby consuming AC power. However, if disable signal DIS03 is high, then NOR gate 234_3 blocks the output of sub-chain 232_2 from propagating through sub-chain 232_3. In that case and in particular, the output of NOR gate 234_3 will be low, the output of inverter 236_3 will be high, a continuous high signal will be applied to the rest of sub-chain 232_3, and the eight different buffers in that sub-chain will not toggle, thereby reducing the consumption of AC power.

As also shown in FIG. 2, NOR gate 254_1 receives both the output 242 of mux 240 and a disable signal DIS11 that can be used to disable sub-chains 252_1 to 252_3 and selectively power down that portion of delay element 200. In particular, if disable signal DIS11 is low, then NOR gate 254_1 allows the output of mux 240 to propagate through sub-chain 252_1. As the output of mux 240 cycles between high and low, the 32 different buffers within sub-chain 252_1 will also toggle between high and low, thereby consuming AC power. However, if disable signal DIS11 is high, then NOR gate 254_1 blocks the output of mux 240 from propagating through sub-chain 252_1. In that case and in particular, the output of NOR gate 254_1 will be low, the output of inverter 256_1 will be high, a continuous high signal will be applied to the rest of sub-chain 252_1, and the 32 different buffers in that sub-chain will not toggle, thereby reducing the consumption of AC power. Moreover, since the output of sub-chain 252_1 is applied to NOR gate 254_2 at the input of sub-chain 252_2, and since the output of sub-chain 252_2 is applied to NOR gate 254_3 at the input of sub-chain 252_3, setting disable signal DIS11 high, will also effectively power down those two sub-chains as well (independent of the values of disable signals DIS12 and DIS13), thereby further reducing power consumption by delay element 200.

Similarly, NOR gate 254_2 receives both the output of sub-chain 252_1 and disable signal DIS12, which can be used to disable sub-chains 252_2 and 252_3 (even if sub-chain 252_1 is enabled) and selectively power down that portion of delay element 200. In particular, assuming that sub-chain 252_1 is enabled, if disable signal DIS12 is low, then NOR gate 254_2 allows the output of sub-chain 252_1 to propagate through sub-chain 252_2. As the output of sub-chain 252_1 cycles between high and low, the 32 different buffers within sub-chain 252_2 will also toggle between high and low, thereby consuming AC power. However, if disable signal DIS12 is high, then NOR gate 254_2 blocks the output of sub-chain 252_1 from propagating through sub-chain 252_2. In that case and in particular, the output of NOR gate 254_2 will be low, the output of inverter 256_2 will be high, a continuous high signal will be applied to the rest of sub-chain 252_2, and the 32 different buffers in that sub-chain will not toggle, thereby reducing the consumption of AC power. Moreover, since the output of sub-chain 252_2 is applied to NOR gate 254_3 at the input of sub-chain 252_3, setting disable signal DIS12 high, will also effectively power down that sub-chain as well (independent of the value of disable signal DIS13), thereby further reducing power consumption by delay element 200.

Lastly, NOR gate 254_3 receives both the output of sub-chain 252_2 and disable signal DIS13, which can be used to disable sub-chain 252_3 (even if sub-chains 252_1 and 252_2 are enabled) and selectively power down that portion of delay element 200. In particular, assuming that sub-chains 252_1 and 252_2 are enabled, if disable signal DIS13 is low, then NOR gate 254_3 allows the output of sub-chain 252_2 to propagate through sub-chain 252_3. As the output of sub-chain 252_2 cycles between high and low, the 32 different buffers within sub-chain 252_3 will also toggle between high and low, thereby consuming AC power. However, if disable signal DIS13 is high, then NOR gate 254_3 blocks the output of sub-chain 252_2 from propagating through sub-chain 252_3. In that case and in particular, the output of NOR gate 254_3 will be low, the output of inverter 256_3 will be high, a continuous high signal will be applied to the rest of sub-chain 252_3, and the 32 different buffers in that sub-chain will not toggle, thereby reducing the consumption of AC power.

Table I presents a first decoding table that can be implemented within delay element 200 to generate disable signals DIS01 to DIS03 from SEL<4:3>. Similarly, Table II presents an analogous second decoding table that can be implemented within delay element 200 to generate disable signals DIS11 to DIS13 from SEL<6:5>.

TABLE I

DECODER FOR SUB-CHAINS 232_1 TO 232_3

| SEL<4:3> | DIS01 | DIS02 | DIS03 |
|---|---|---|---|
| [00] | 1 | 1 | 1 |
| [01] | 0 | 1 | 1 |
| [10] | 0 | 0 | 1 |
| [11] | 0 | 0 | 0 |

TABLE II

| DECODER FOR SUB-CHAINS 252_1 TO 252_3 | | | |
|---|---|---|---|
| SEL<6:5> | DIS11 | DIS12 | DIS13 |
| [00] | 1 | 1 | 1 |
| [01] | 0 | 1 | 1 |
| [10] | 0 | 0 | 1 |
| [11] | 0 | 0 | 0 |

As indicated in Table I, when mux 240 is controlled to select the output 222 of mux 220 as its output signal (i.e., SEL<4:3>=[00]), then sub-chains 232_1 to 232_3 will all be disabled and powered down. Similarly, when mux 240 is controlled to select the output of sub-chain 232_1 as its output signal (i.e., SEL<4:3>=[01]), then sub-chain 232_1 will be enabled, while sub-chains 232_2 and 232_3 are disabled and powered down. When mux 240 is controlled to select the output of sub-chain 232_2 as its output signal (i.e., SEL<4:3>=[10]), then sub-chains 232_1 and 232_2 will be enabled, while sub-chain 232_3 is disabled and powered down. Lastly, when mux 240 is controlled to select the output of sub-chain 232_3 as its output signal (i.e., SEL<4:3>=[11]), then all three sub-chains 232_1 to 232_3 will be enabled.

As indicated in Table II, when mux 260 is controlled to select the output 242 of mux 240 as its output signal (i.e., SEL<6:5>=[00]), then sub-chains 252_1 to 252_3 will all be disabled and powered down. Similarly, when mux 260 is controlled to select the output of sub-chain 252_1 as its output signal (i.e., SEL<6:5>=[01]), then sub-chain 252_1 will be enabled, while sub-chains 252_2 and 252_3 are disabled and powered down. When mux 260 is controlled to select the output of sub-chain 252_2 as its output signal (i.e., SEL<6:5>=[10]), then sub-chains 252_1 and 252_2 will be enabled, while sub-chain 252_3 is disabled and powered down. Lastly, when mux 260 is controlled to select the output of sub-chain 252_3 as its output signal (i.e., SEL<6:5>=[11]), then all three sub-chains 252_1 to 252_3 will be enabled.

In this way, with the possible exception of one or more buffers in delay chain 210, those portions of delay element 200 that are not being actively used to generate output signal Z can be disabled and powered down to reduce the overall power consumption of delay element 200. This is a significant improvement compared to delay element 100 of FIG. 1, in which all of the buffers are enabled and consuming AC power whenever delay element 100 is used to generate output signal Z.

Figure 3:
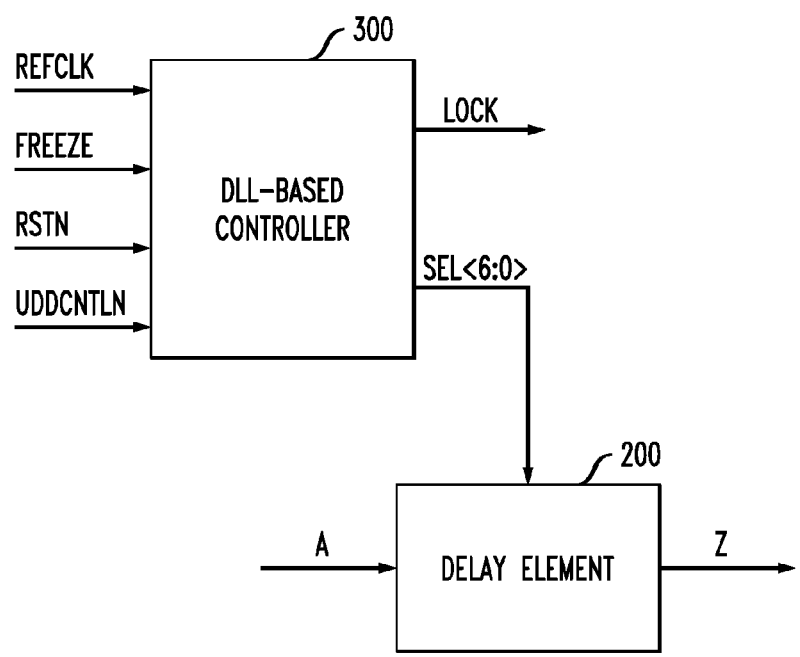
FIG. 3 shows a block diagram of controller configured to generate the delay code used to control the operations of the delay element of FIG. 2.

FIG. 3 shows a block diagram of DLL-based controller 300 configured to generate delay code SEL <6:0> used to control the operations of delay element 200 of FIG. 2. Of particular significance is the fact that the reference clock REFCLK used to drive controller 300 has an unknown and uncontrolled phase relationship with respect to input (e.g., clock) signal A applied to delay element 200. Given the unknown phase relationship between REFCLK and input signal A, unless special processing is performed, it would be possible for changes in the value of delay code SEL<6:0> to cause in glitches in output signal Z that can result in downstream data corruption and word misalignment. Such glitches can occur when the value of delay code SEL<6:0> changes at a time when the buffers in delay element 200 are in different states (i.e., some buffers are generating an output of 1, while other buffers are generating an output value of 0).

Figure 4:
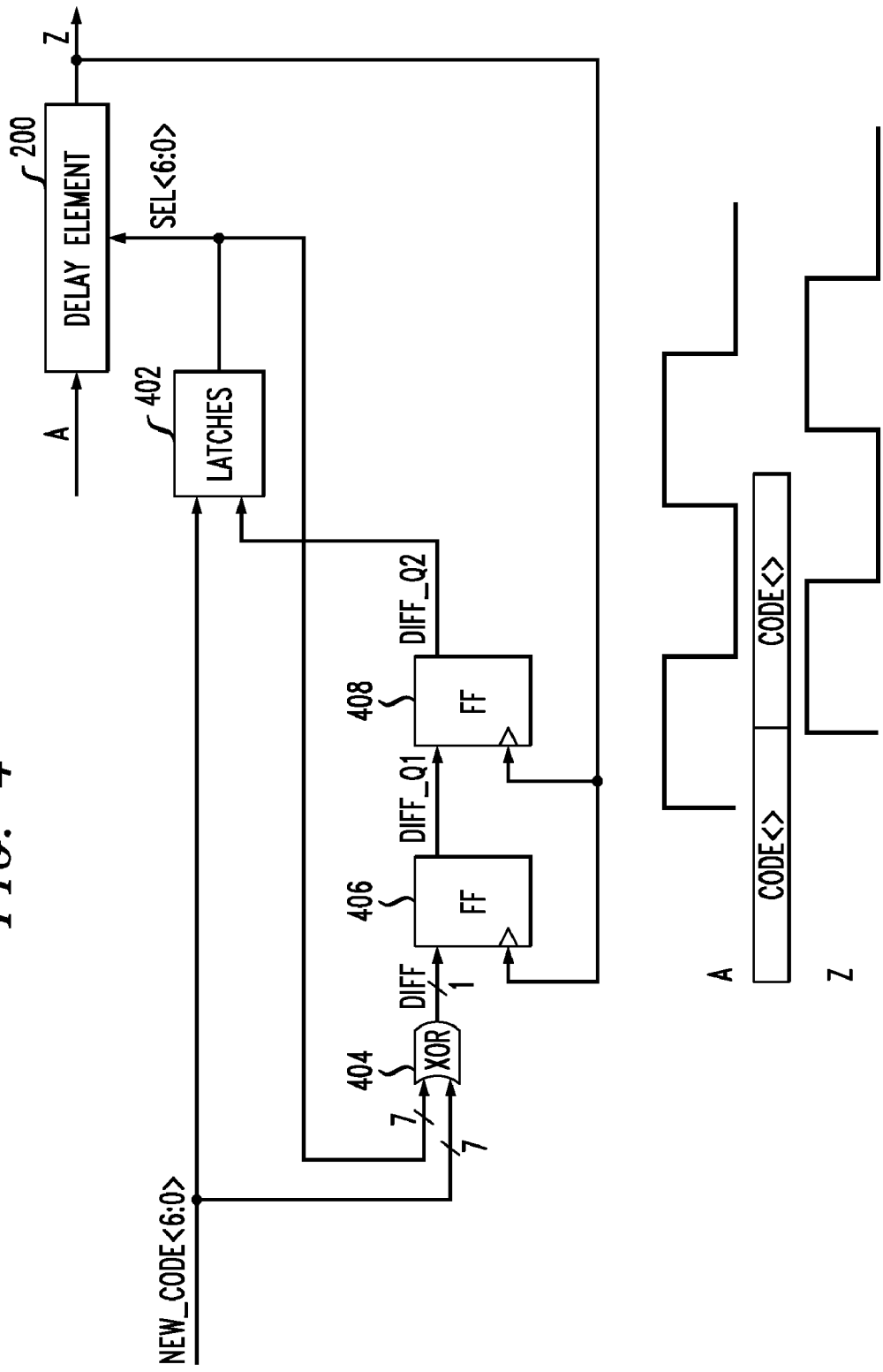
FIG. 4 shows a schematic block diagram of a portion of the controller of FIG. 3 that provides a glitch-less output signal Z when the delay code is updated to change the amount of delay applied by the delay element of FIG. 2, according to one embodiment of the present invention.

FIG. 4 shows a schematic block diagram of a portion of controller 300 of FIG. 3 that provides a glitch-less output signal Z when delay code SEL<6:0> is updated to change the amount of delay applied by delay element 200 of FIG. 2, according to one embodiment of the present invention. In particular, the portion of controller 300 shown in FIG. 4 ensures that changes in delay code SEL<6:0> applied to delay element 200 occur soon after a rising edge in output signal Z. Since output signal Z is typically and nominally delayed by about 90 degrees with respect to input signal A, changes in delay code SEL<6:0> will typically and nominally occur just after the middle of a high pulse in input signal A. During this time period, the outputs from all of the 128 different buffers in delay element 200 will be the same (i.e., 1). As such, changing the value of delay code SEL<6:0> will not result in any glitches in output signal Z.

In particular, as shown in FIG. 4, latches 402 (e.g., one latch for each bit in delay code SEL<6:0>) store and apply the previous value of 7-bit delay code SEL<6:0> to delay element 200. When controller 300 determines that the value of delay code SEL<6:0> needs to be changed (using other circuitry not shown in FIG. 4), the new value for delay code SEL<6:0> is applied to the data inputs of latches 402 as signal NEW_CODE<6:0>. Previous delay code SEL<6:0> and new delay code NEW_CODE<6:0> are applied to the inputs of XOR logic 404. As long as the value of NEW_CODE<6:0> is the same as the value of SEL<6:0>, XOR logic 404 will generate an output signal DIFF of 0. But as soon as the value of NEW_CODE<6:0> differs from the value of SEL<6:0>, XOR logic 404 will generate an output signal DIFF of 1.

At the next rising edge of output clock Z, flip-flop 406 will forward its input value DIFF of 1 to its output value DIFF_Q1. Similarly, at the subsequent rising edge of output clock Z, flip-flop 408 will forward its input value DIFF_Q1 of 1 to its output value DIFF_Q2. Applying the value DIFF_Q2 of 1 to the trigger inputs of latches 402 will cause the value of NEW_CODE<6:0> to be stored in latches 402 and applied to delay element 200 as SEL<6:0>. The time duration that it takes for the new value of SEL<6:0> to be applied to delay element 200 following the most-recent rising edge of output signal Z will be the sum of (i) the clock-to-Q delay of flip-flop 408 and (ii) the gate-to-output delay of latches 402. This time duration should be short enough to ensure that all of the changes in the operations of delay element 200 resulting from the change in the value of SEL<6:0> will be completed before the next falling edge of input signal A.

Note that, for a given previous value of SEL<6:0>, zero, one, or more of sub-chains 232_1 to 232_3 and 252_1 to 252-3 of FIG. 2 may be enabled, while the remaining zero, one, or more of those sub-chains will be disabled. The sub-chains are designed, using NOR gates 234_1 to 234_3 and 254_1 to 254_3, such that the output of each buffer in a disabled sub-chain is 1. Moreover, for a nominal 90-degree phase difference between input signal A and output signal Z where each rising edge in output signal Z occurs near the middle of a high pulse in input signal A, the output of each buffer in delay chain 210 and in each enabled sub-chain will be 1. As such, applying changes in delay code SEL<6:0> soon after a rising edge of output signal Z should ensure that all of the buffers in delay element 200 are in the same state (i.e., having an output value of 1). As a result, the value of delay code SEL<6:0> will change without generating any glitches in output signal Z, thereby avoiding data corruption and/or word misalignment that can result from such glitches.

Figure 5:
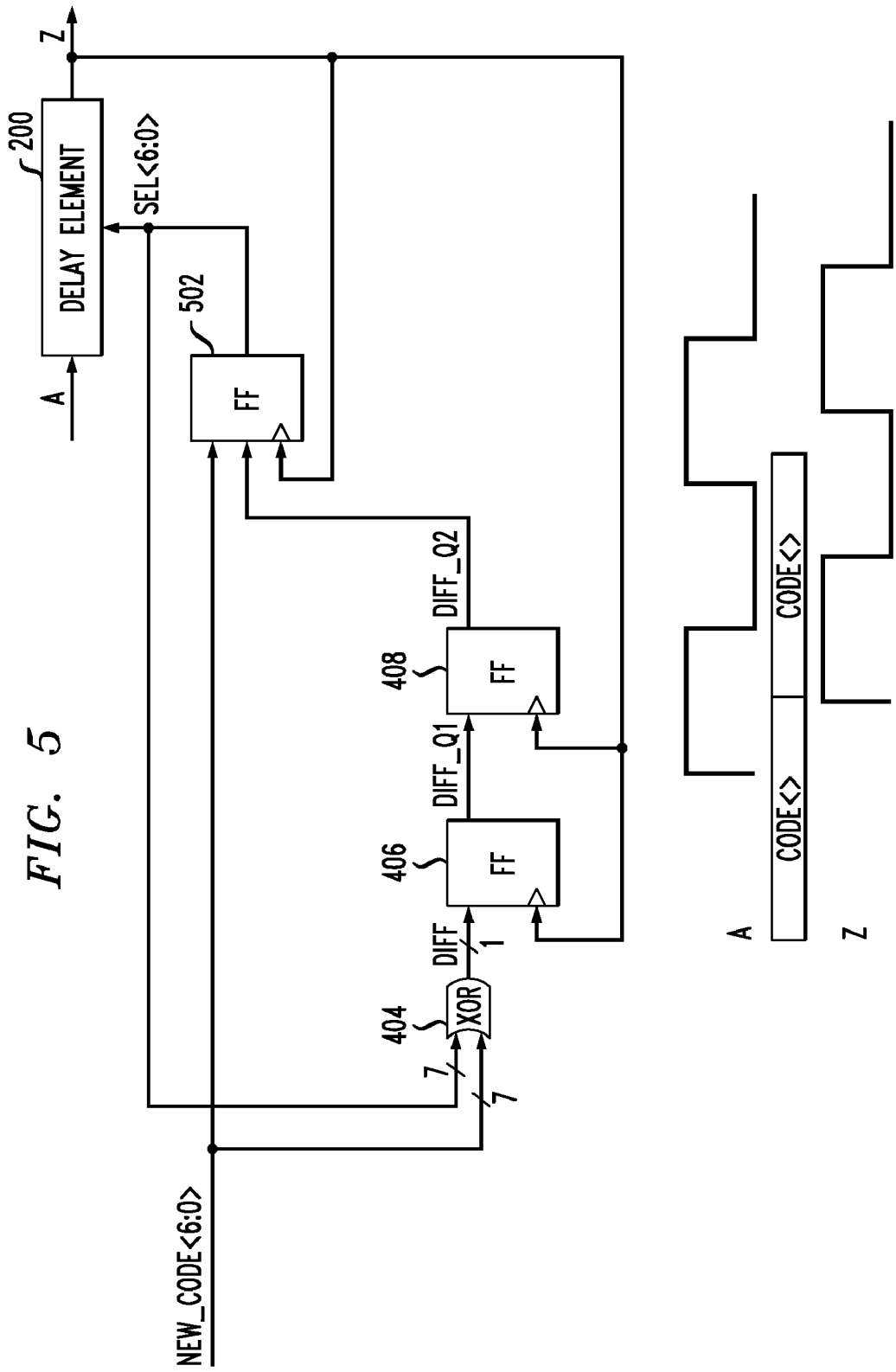
FIG. 5 shows a schematic block diagram of a portion of the controller of FIG. 3 that provides a glitch-less output signal Z when the delay code is updated to change the amount of delay applied by the delay element of FIG. 2, according to another embodiment of the present invention.

FIG. 5 shows a schematic block diagram of a portion of controller 300 of FIG. 3 that provides a glitch-less output signal Z when the delay code is updated to change the amount of delay applied by delay element 200 of FIG. 2, according to another embodiment of the present invention. The embodiment of FIG. 5 is analogous to the embodiment of FIG. 4, except that latches 402 are replaced by flip-flops 502 (e.g., one flip-flop for each bit in delay code SEL<6:0>), where signal DIFF_Q2 is applied as the enable signal to each of flip-flops 502, which are triggered by rising edges in output signal Z. In this embodiment, the time duration from the most-recent rising edge of output signal Z until the change in delay code SEL<6:0> is applied to delay element 200 is just the clock-to-Q delay of flip-flops 502, which is shorter than the time duration for the embodiment of FIG. 4. The shorter time duration provides even greater assurance that changes in delay code SEL<6:0> will not result in glitches in output signal Z, albeit at the expense of slightly greater layout area due to flip-flops being roughly twice as large as latches.

Although the embodiment of FIG. 2 has AND gate 212 at the beginning of delay chain 210 and a NOR gate 234_i or 254_i at the beginning of each sub-chain 232_i or 252_i, those skilled in the art will understand that logic circuitry comprising different types and/or different combinations of logic elements can be employed to selectively enable and disable different portions of delay element 200 in alternative implementations of the present invention.

Although the present invention has been described in the context of a delay element configurable to provide any of 128 different amounts of delay, the present invention is not so limited. For example, referring to FIG. 2, a delay element configurable to provide any of 32 different amounts of delay can be achieved by omitting sub-chains 252_1 to 252_3 and mux 260 and treating the output 242 of mux 240 as output signal Z. Alternatively, one or more additional stages of sub-chains and muxes can be added to the embodiment of FIG. 2 to provide configurable delay elements having more than 128 different amounts of delay.

Note that, in FIG. 2, for a given stage, each sub-chain contains as many buffers as in all of the previous stages. Thus, the first stage (i.e., delay chain 210) contains eight buffers, and each sub-chain 232_i in the second stage (i.e., delay chain 230) contains eight buffers. Similarly, the first two stages (i.e., delay chains 210 and 230) contain 32 buffers, and each sub-chain 252_i in delay chain 250 contains 32 buffers. This pattern in the embodiment of FIG. 2 can be generalized to design delay elements according to other embodiments of the present invention having different numbers of stages, different numbers of buffers per sub-chain, and/or different numbers of sub-chains per stage (and therefore different sizes of muxes). For example, a 64-tap delay element (controlled by a 6-bit delay code) can be implemented using a 4-buffer chain and a (4×1) mux in the first stage, three 4-buffer sub-chains and a (4×1) mux in the second stage, and three 16-buffer sub-chains and a (4×1) mux in the third stage.

The present invention can be implemented in the context of any suitable type of integrated circuit device, such as, without limitation, application-specific integrated circuits (ASICs), field-programmable gate arrays (FPGAs), programmable logic devices (PLDs), mask-programmable gate arrays (MP-GAs), simple programmable logic devices (SPLDs), and complex programmable logic devices (CPLDs).

The present invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

We claim:

1. An integrated circuit having a configurable delay element connected to generate an output signal (e.g., Z) as a delayed version of an input signal (e.g., A), the delay element comprising:
 a first stage comprising:
  a first delay chain (e.g., 210) having N buffers connected to receive the input signal and generate N differently delayed versions of the input signal; and
  an (N×1) first mux (e.g., 220) connected to receive the N versions of the input signal and output one of the N versions of the input signal as a first-stage output signal; and
 a second stage comprising:

a second delay chain (e.g., 230) having N(M−1) buffers connected to receive the first-stage output signal and organized into (M−1) sub-chains (e.g., 232_1 to 232_3) to generate M differently delayed versions of the first-stage output signal; and an (M×1) second mux (e.g., 240) connected to receive the M versions of the first-stage output signal and output one of the M versions of the first-stage output signal as a second-stage output signal.

2. The invention of claim 1, wherein the M versions of the first-stage output signal applied to the second mux are (i) the first-stage output signal and (ii) the outputs from the (M−1) sub-chains in the second delay chain.

3. The invention of claim 1, wherein the configurable delay element further comprises a third stage comprising:

a third delay chain (e.g., 250) having NM(P−1) buffers connected to receive the second-stage output signal and organized into (P−1) sub-chains (e.g., 252_1 to 252_3) to generate P differently delayed versions of the second-stage output signal; and a (P×1) third mux (e.g., 260) connected to receive the P versions of the second-stage output signal and output one of the P versions of the second-stage output signal as a third-stage output signal (e.g., Z).

4. The invention of claim 3, wherein the P versions of the second-stage output signal applied to the third mux are (i) the second-stage output signal and (ii) the outputs from the (P−1) sub-chains in the third delay chain.

5. The invention of claim 3, wherein N=8 and M=P=4, such that:

the first delay chain (e.g., 210) of eight buffers is connected to receive the input signal (e.g., A) and generate eight differently delayed versions of the input signal;

the (8×1) first mux (e.g., 220) is connected to receive the eight versions of the input signal and output one of the eight versions of the input signal as the first-stage output signal;

the second delay chain (e.g., 230) of 24 buffers is connected to receive the first-stage output signal and organized into three sub-chains (e.g., 232_1 to 232_3) to generate four differently delayed versions of the first-stage output signal;

the (4×1) second mux (e.g., 240) is connected to receive the four versions of the first-stage output signal and output one of the four versions of the first-stage output signal as the second-stage output signal;

the third delay chain (e.g., 250) of 96 buffers connected to receive the second-stage output signal and organized into three sub-chains (e.g., 252_1 to 252_3) to generate four differently delayed versions of the second-stage output signal; and the (4×1) third mux (e.g., 260) is connected to receive the four versions of the second-stage output signal and output one of the four versions of the second-stage output signal as the third-stage output signal (e.g., Z).

6. The invention of claim 1, wherein each sub-chain (e.g., 232_i) in the second delay chain has a first buffer (e.g., 234_i and 236_i) implemented with logic circuitry that receives a sub-chain control signal (e.g., DIS0i) that selectively disables the sub-chain.

7. The invention of claim 6, wherein the sub-chain control signal selectively disables the sub-chain and any subsequent sub-chain in the second delay chain.

8. The invention of claim 6, wherein the logic circuitry comprises a NOR gate (e.g., 234_i) that receives (i) a version of the first-stage output signal and (ii) the sub-chain control signal, such that:

when the sub-chain control signal is high, the version of the first-stage output signal will not propagate through the sub-chain; and when the sub-chain control signal is low, the version of the first-stage output signal will propagate through the sub-chain.

9. The invention of claim 6, wherein the second mux is controlled by a second mux control signal (e.g., SEL<4:3>) that is decoded to generate the sub-chain control signal for the logic circuitry of each sub-chain.

10. The invention of claim 1, wherein the integrated circuit further comprises a controller (e.g., 300) adapted to generate and update a delay code (e.g., SEL<6:0>) used to configure the configurable delay element, wherein the controller is adapted to change value of the delay code such that the delay element generates a glitch-less output signal.

11. The invention of claim 10, wherein the controller controls timing of each change in the delay code value to occur when all of the buffers in the first and second delay chains have the same state.

12. The invention of claim 10, wherein the controller controls timing of each change in the delay code value based on timing of the output signal generated by the delay element.

13. The invention of claim 12, wherein the controller comprises:

memory circuitry (e.g., 402, 502) that stores a previous delay code value;

logic circuitry (e.g., 404) that compares the previous delay code value with a new delay code value to generate a signal (e.g., DIFF) indicating whether or not the new delay code value is different from the previous delay code value; and timing circuitry (e.g., 406, 408) that controls the timing of applying the new delay code value to the delay element based on the timing of the output signal generated by the delay element.

14. The invention of claim 13, wherein the memory circuitry comprises a latch (e.g., 402) for each bit of the delay code value.

15. The invention of claim 13, wherein the memory circuitry comprises a flip-flop (e.g., 502) for each bit of the delay code value.

16. The invention of claim 1, wherein the configurable delay element is part of a receiver interface in the integrated circuit.

17. The invention of claim 1, wherein the integrated circuit is a programmable logic device.

18. The invention of claim 17, wherein the programmable device is an FPGA.

19. The invention of claim 1, wherein:

the M versions of the first-stage output signal applied to the second mux are the first-stage output signal and the outputs from the (M−1) sub-chains in the second delay chain;

each sub-chain (e.g., 232_i) in the second delay chain has a first buffer (e.g., 234_i and 236_i) implemented with logic circuitry that receives a sub-chain control signal (e.g., DIS0i) that selectively disables the sub-chain and any subsequent sub-chain in the second delay chain;

the logic circuitry comprises a NOR gate (e.g., 234_i) that receives (i) a version of the first-stage output signal and (ii) the sub-chain control signal, such that:

when the sub-chain control signal is high, the version of the first-stage output signal will not propagate through the sub-chain; and when the sub-chain control signal is low, the version of the first-stage output signal will propagate through the sub-chain;

the second mux is controlled by a second mux control signal (e.g., SEL<4:3>) that is decoded to generate the sub-chain control signal for the logic circuitry of each sub-chain;

the integrated circuit further comprises a controller (e.g., 300) adapted to generate and update a delay code (e.g., SEL<6:0>) used to configure the configurable delay element, wherein the controller is adapted to change value of the delay code such that the delay element generates a glitch-less output signal;

the controller controls timing of each change in the delay code value to occur when all of the buffers in the first and second delay chains have the same state;

the controller comprises:
  memory circuitry (e.g., 402, 502) that stores a previous delay code value;
  logic circuitry (e.g., 404) that compares the previous delay code value with a new delay code value to generate a signal (e.g., DIFF) indicating whether or not the new delay code value is different from the previous delay code value; and
  timing circuitry (e.g., 406, 408) that controls the timing of applying the new delay code value to the delay element based on the timing of the output signal generated by the delay element;

the configurable delay element is part of a receiver interface in the integrated circuit; and the integrated circuit is an FPGA.

20. The invention of claim 19, wherein:

the configurable delay element further comprises a third stage comprising:
  a third delay chain (e.g., 250) having NM(P−1) buffers connected to receive the second-stage output signal and organized into (P−1) sub-chains (e.g., 252_1 to 252_3) to generate P differently delayed versions of the second-stage output signal; and
  a (P×1) third mux (e.g., 260) connected to receive the P versions of the second-stage output signal and output one of the P versions of the second-stage output signal as a third-stage output signal (e.g., Z); and the P versions of the second-stage output signal applied to the third mux are the second-stage output signal and the outputs from the (P−1) sub-chains in the third delay chain.

* * * * *